(12) United States Patent
de Bock et al.

(10) Patent No.: US 8,694,065 B2
(45) Date of Patent: Apr. 8, 2014

(54) CRYOGENIC COOLING SYSTEM WITH WICKING STRUCTURE

(75) Inventors: Hendrik Pieter Jacobus de Bock, Clifton Park, NY (US); Jalal Hunain Zia, Niskayuna, NY (US); Ernst Wolfgang Stautner, Niskayuna, NY (US); Tao Deng, Clifton Park, NY (US); Longzhi Jiang, Florence, SC (US); William Louis Einziger, Florence, SC (US); Wen Shang, Clifton Park, NY (US); Yuri Lvovsky, Florence, SC (US); Kathleen Melanie Amm, Clifton Park, NY (US); Gregory Citver, Danvers, MA (US); Tao Zhang, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 92 days.

(21) Appl. No.: 13/242,057

(22) Filed: Sep. 23, 2011

(65) Prior Publication Data
US 2013/0079229 A1    Mar. 28, 2013

(51) Int. Cl.
*H01F 6/06* (2006.01)
(52) U.S. Cl.
USPC .......................................... 505/163; 324/318
(58) Field of Classification Search
USPC ............ 505/163, 899; 62/50.1–21.1; 324/318
See application file for complete search history.

(56) References Cited

U.S. PATENT DOCUMENTS

| | | | | |
|---|---|---|---|---|
| 3,892,273 A * | 7/1975 | Nelson | ...................... | 165/104.26 |
| 4,118,756 A * | 10/1978 | Nelson et al. | .................. | 361/700 |
| 4,247,830 A * | 1/1981 | Karras et al. | ..................... | 372/56 |
| 4,765,396 A * | 8/1988 | Seidenberg | .............. | 165/104.26 |
| 5,156,827 A * | 10/1992 | Tom et al. | ...................... | 423/299 |
| 5,417,073 A * | 5/1995 | James et al. | .................... | 62/51.1 |
| 5,461,873 A | 10/1995 | Longsworth | | |
| 6,550,530 B1 | 4/2003 | Bilski | | |
| 6,875,247 B2 * | 4/2005 | TeGrotenhuis et al. | ......... | 55/319 |
| 6,948,556 B1 * | 9/2005 | Anderson et al. | ............. | 165/80.4 |
| 6,960,404 B2 * | 11/2005 | Goebel | .......................... | 429/414 |
| 7,263,841 B1 | 9/2007 | Arman et al. | | |
| 7,305,850 B2 * | 12/2007 | Tonkovich et al. | .............. | 62/617 |
| 2004/0159422 A1 * | 8/2004 | Zuo et al. | .................. | 165/104.14 |
| 2005/0001621 A1 | 1/2005 | Laskaris et al. | | |
| 2005/0005617 A1 | 1/2005 | Jibb | | |
| 2005/0229553 A1 * | 10/2005 | TeGrotenhuis et al. | ......... | 55/319 |

(Continued)

FOREIGN PATENT DOCUMENTS

EP         715180 B1    6/2000
WO    2005116516 A1   12/2005

OTHER PUBLICATIONS

Search Report from corresponding GB Application No. GB1216311.9 dated Mar. 4, 2013.

*Primary Examiner* — Colleen Dunn
(74) *Attorney, Agent, or Firm* — Paul J. DiConza

(57) ABSTRACT

A cryogenic cooling system includes a chamber defined by an outer wall and an inner wall, the chamber housing at least one component to be cooled; a wicking structure in thermal contact with one of the outer wall and the inner wall of the chamber; and a delivery system in a spaced apart relationship with the chamber and fluidly connected to the wicking structure for transporting a working fluid to and from the wicking structure. Also provided is a magnetic resonance imaging system including the cryogenic cooling system.

20 Claims, 3 Drawing Sheets

(56) References Cited

U.S. PATENT DOCUMENTS

| | | | |
|---|---|---|---|
| 2008/0307800 A1* | 12/2008 | Levin et al. .................... 62/50.7 |
| 2009/0120615 A1* | 5/2009 | Icoz et al. ................ 165/104.11 |
| 2009/0200006 A1 | 8/2009 | Kroliczek et al. |
| 2010/0066367 A1* | 3/2010 | Ma et al. ....................... 324/318 |
| 2010/0162730 A1* | 7/2010 | Levin et al. .................... 62/50.7 |
| 2010/0295642 A1 | 11/2010 | Hahn et al. |

\* cited by examiner

CRYOGENIC COOLING SYSTEM WITH WICKING STRUCTURE

BACKGROUND

The invention relates generally to a cooling system for an imaging system and, more particularly, to a wicking structure for a cryogenic cooling system in a magnetic resonance imaging (MRI) device.

Imaging devices, such as magnetic resonance imaging (MRI) devices, are typically used to diagnose patients in medical environments. The generated magnetic resonance image is a map of weak magnetization originated from the atomic nuclei in the body tissue as influenced by presence of an external magnetic field. By detecting these influences, MRI devices produce detailed images of a patient's internal tissues and organs, thereby enabling diagnosis of disease, injuries, among other physiological conditions of a patient.

In the traditional MRI system, the superconductive electromagnet has a number of loops of coiled wire that are bathed in a cryogenic fluid, such as liquid helium. This cryogenic fluid cools the coiled wire to extremely low temperatures, maintaining the magnet in a superconducting state. Cryogenic cooling system employed for cooling the imaging device components utilize abundant amount of the cryogenic fluid to provide localized cooling, thereby increasing the cost and also the complexity of the system. Thermal insulating material and other heat transfer barriers, such as vacuum regions, are often provided to insulate the magnet and cryogenic fluid, to impede heat transfer between the magnet and the environment.

Unfortunately, cryogenic systems, such as MRI systems, utilize large amounts of coolant, for example, about 1000 to 2000 liters of Helium, to provide localized cooling to the superconducting coils and cryogenic vessel walls. The coolant required in conventional cryogenic systems is very costly. Current systems use excess amount of helium to maintain the magnet in its superconducting state at all times. In current machines the annular cavity between the superconducting magnet and the inner cryogenic vessel walls are filled with liquid helium, commonly fully or partially submerging the superconducting magnets. During operation, a small amount of heat can be generated at the surface of a partially-submerged superconducting magnet coil and a fraction of the total liquid helium volume is boiled off. In addition, even though the cryogenic vessel containing the superconducting magnet uses superior insulation, a small amount of heat from the outside will conduct into the cryogenic vessel causing additional liquid helium boiloff.

In general, the MRI device is topped off with liquid helium at the factory where it is produced and then shipped to the customer, which could be anywhere around the world. During this transportation process, typically a significant greater amount of liquid helium is lost. At arrival at the customer site, the machine is topped off again with liquid helium. Due to availability and scarcity of high purity liquid helium at different locations in the world this might be very costly. Therefore, reducing the total liquid helium amount of the cryogenic vessel is beneficial.

BRIEF DESCRIPTION

The problem of reducing the amount of coolant required during operation in a cryogenic system is solved by the use of a wicking structure that is in thermal contact with a component to be cooled, for example, one of the walls through which heat enters the system, the cryogenic vessel walls, the superconducting magnet or the individual superconducting coils of the cryogenic system. This provides a local cooling structure around the components to be cooled such that the liquid helium is only required at the exact location where heat enters the system. In addition to reducing the amount of coolant required during operation, the wicking system improves temperature uniformity and cryostability of the individual components and enhances the quench stability margins of the superconducting magnets as the superconducting magnet can now be fully surrounded by liquid helium versus the status quo where the liquid helium bath might only submerge the magnet partially.

One aspect of the invention, a cryogenic cooling system comprises a chamber defined by an outer wall and an inner wall, the chamber housing at least one component to be cooled; a wicking structure in thermal contact with one of the outer wall and the inner wall of the chamber; and a delivery system in a spaced apart relationship with the chamber and fluidly connected to the wicking structure for transporting a working fluid to and from the wicking structure.

Another aspect of the present invention provides a magnetic resonance imaging system. The magnetic resonance imaging system includes an imaging volume to image a subject; a superconducting coil structure surrounding the imaging volume; and a cryogenic cooling system. The cryogenic cooling system comprises a chamber defined by an outer wall and an inner wall, the chamber housing at least one component to be cooled; a wicking structure in thermal contact with one of the outer wall and the inner wall of the chamber; and a delivery system in a spaced apart relationship with the chamber and fluidly connected to the wicking structure for transporting a working fluid to and from the wicking structure.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
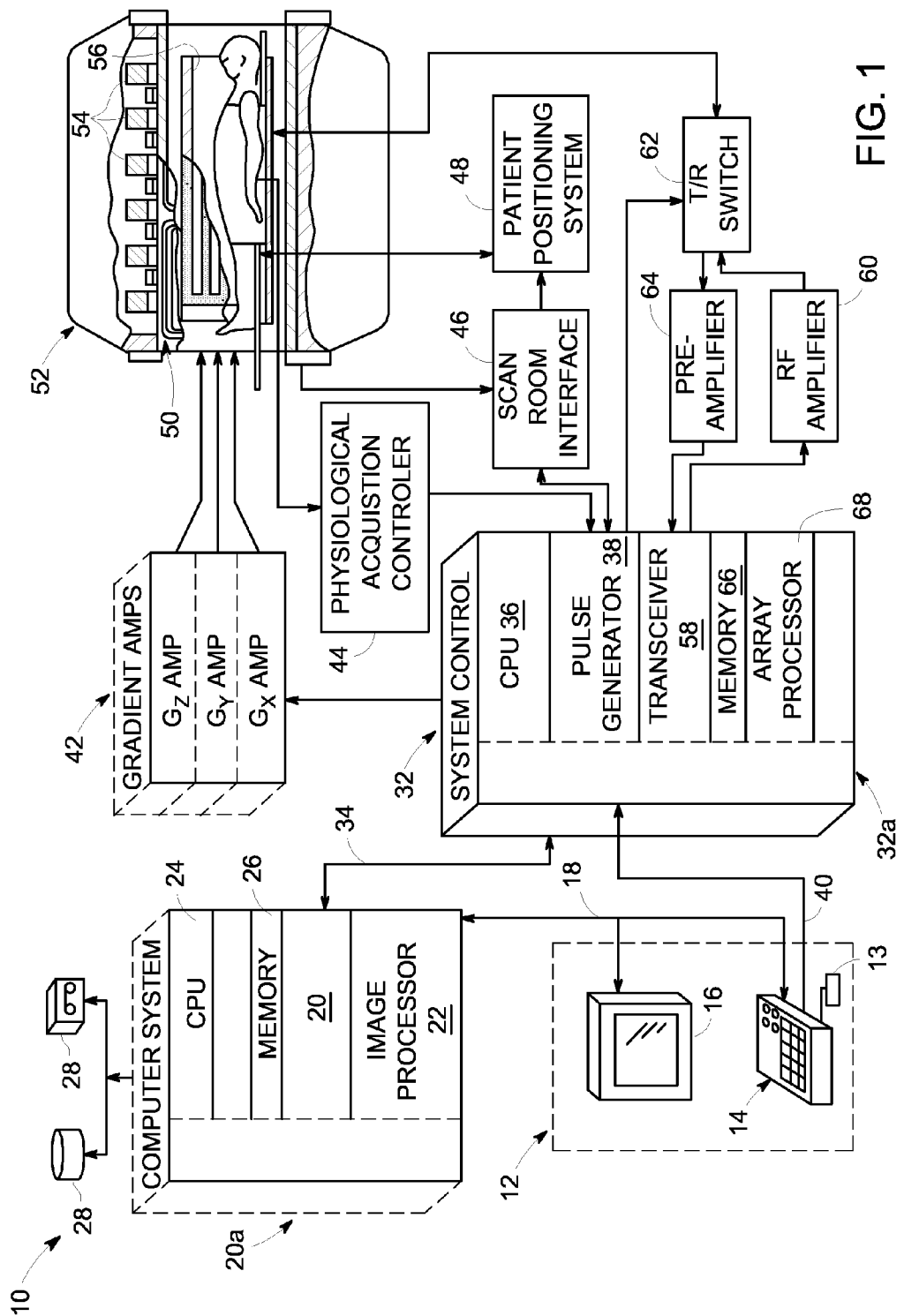
FIG. 1 illustrates a block diagram of a magnetic resonance (MR) imaging system incorporating an embodiment of the invention.

While only certain features of the invention have been illustrated and described herein, many modifications and changes will occur to those skilled in the art. It is, therefore, to be understood that the appended claims are intended to cover all such modifications and changes as fall within the true spirit of the invention. In the specification and claims, reference will be made to a number of terms, which have the following meanings.

The singular forms "a", "an" and "the" include plural referents unless the context clearly dictates otherwise. Approximating language, as used herein throughout the specification and claims, may be applied to modify any quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Similarly, "free" may be used in combination with a term, and may include an insubstantial number, or trace amounts, while still being considered free of the modified term.

As used herein, the terms "may" and "may be" indicate a possibility of an occurrence within a set of circumstances; a possession of a specified property, characteristic or function; and/or may qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances, an event or capacity can be expected, while in other circumstances, the event or capacity cannot occur—this distinction is captured by the terms "may" and "may be".

"Optional" or "optionally" means that the subsequently described event or circumstance may or may not occur, and that the description includes instances where the event occurs and instances where it does not. The terms "comprising", "including", and having are intended to be inclusive and mean that there may be additional elements other than the listed elements. Furthermore, whenever a particular feature of the invention is said to consist of at least one of a number of elements of a group and combinations thereof, it is understood that the feature may comprise or consist of any of the elements of the group, either individually or in combination with any of the other elements of that group.

It is also understood that terms such as "top," "bottom," "outward," "inward," and the like are words of convenience and are not to be construed as limiting terms. As used herein, the terms "disposed over", or "disposed between" refers to both secured or disposed directly in contact with and indirectly by having intervening layers therebetween.

As previously noted, one embodiment of the present invention is provides a cryogenic cooling system. The cryogenic cooling system includes a chamber defined by an outer wall; at least one heat source disposed within the chamber; a wicking structure; a delivery system; and a heat sink disposed within the chamber in a spaced apart relationship with the heat source. The wicking structure is in conformal contact with the heat source. The delivery system is disposed to receive at least a portion of a liquid from the wicking structure.

Referring to FIG. 1, the major components of a magnetic resonance imaging (MRI) system 10 are shown according to an embodiment of the invention. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

During operation, the MR apparatus 10 consumes large amounts of electrical power. In particular, the gradient coils 54 and the RF coil 56 consume excessive amounts of power. These heat generating components, among others, generate significant heat, typically on the order of tens of kilowatts. In addition, heat loads from thermal radiation of the inner and outer helium vessel shell, suspension of the helium vessel, transient heat loads due to gradient system interaction (when in operation and taking images), room temperature wiring to cryostat, and tubes and other penetrations may generate excessive heat. As one would expect, excessive heat can cause system components to deteriorate or fail prematurely, and hence adversely affects reliability. Moreover, rise in temperatures causes an increase in electrical resistance and a reduction in coil currents and low coil currents affects signal generation, resulting in poor image resolution. In addition, heat can be an annoyance to a patient during the imaging process and, if excessive, could injure a patient. For this reason, there are regulations that stipulate the maximum temperature of a patient support table that effectively limits the amount of power that can be used in any MRI system.

The problem of reducing the amount of cryogenic refrigerant required during operation in a cryogenic system is solved by the use of a wicking structure that is in thermal contact with the walls through which heat enters the cryogenic system, the cryogenic vessel walls, the superconducting magnet or the individual superconducting coils of the cryogenic system. This provides a local cooling structure around the components to be cooled such that the liquid helium is only required at the exact location where heat enters the system. In addition to reducing the amount of coolant required during operation, the wicking system improves temperature uniformity and cryostability of the individual components and enhances the quench stability margins of the superconducting magnets as the superconducting magnet can now be fully surrounded by liquid helium versus the status quo where the liquid helium bath might only submerge the magnet partially.

Figure 2:
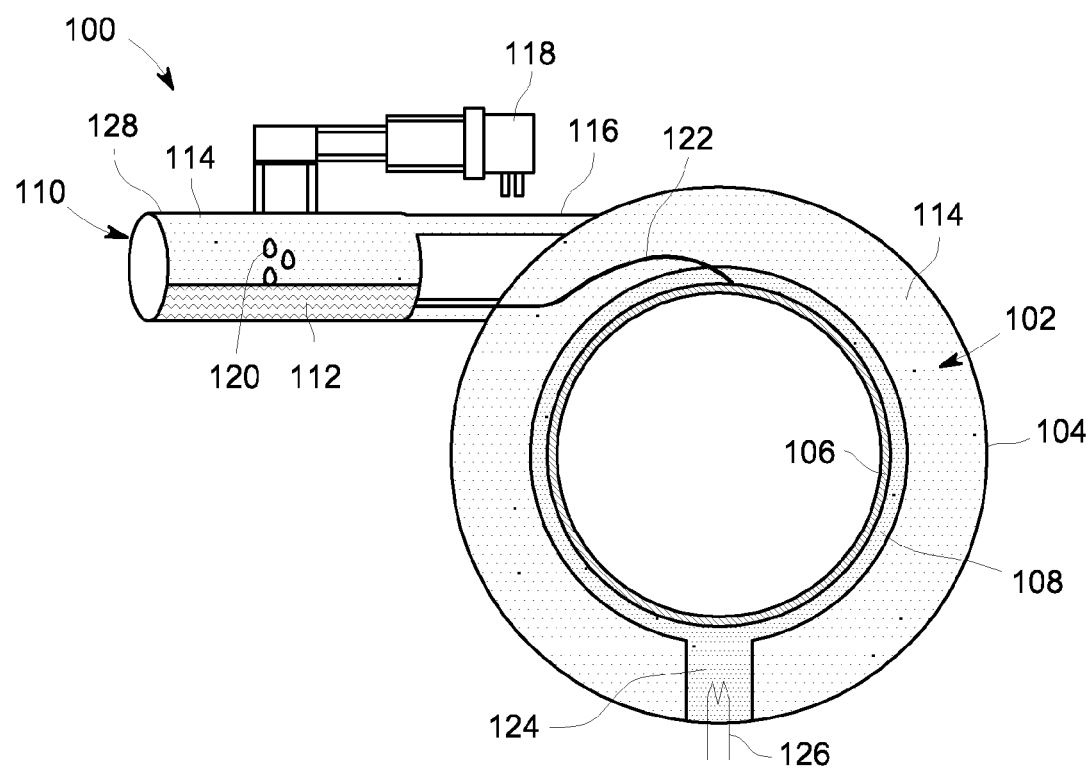
FIG. 2 is an end cross-sectional view of a "top feed" cryogenic cooling system with a wicking structure in thermal contact with an inner wall of a chamber according to an embodiment of the invention.

FIG. 2 represents a schematic of the cryogenic cooling system 100 according to one embodiment of the invention. The cryogenic cooling system 100 includes an annular chamber 102 defined by an outer wall 104 and an inner wall 106. The annular chamber 102 is maintained at a suitable pressure, and may be hermetically sealed. The annular chamber 102 houses at least one component 108 to be cooled, for example, an internal heat source (within the chamber 102) or an external heat source (outside the chamber 102). In another embodiment, the component 108 to be cooled is selected from the superconducting electromagnet 54, cryovessel walls 104, 106, or any other superconducting magnet component and combinations thereof.

One aspect of the invention is that the cryogenic cooling system 100 includes a wicking structure 108 disposed within the annular chamber 102. In the embodiment shown in FIG. 2, the wicking structure 108 is in thermal contact with the inner wall 106. The term "thermal contact" as used herein refers to direct or indirect contact with the surface of the component to be cooled without leading to voids created by the natural roughness of the component. In one embodiment, the wicking structure 108 is in thermal contact with the inner wall 106 in a continuous manner around the circumference of the inner wall 106 (as shown in FIG. 2). In one embodiment, the wicking structure 108 is in thermal contact with the inner wall 106 in an intermittent manner around the circumference of the inner wall 106. The wicking structure 108 can be in indirect contact with the inner wall 106, i.e., thermal contact is achieved by thermal conduction through another component between the wicking structure 108 and the inner wall 106.

In one embodiment, the wicking structure 108 includes sintered particles. Non-limiting examples of the wicking structure 108 include stainless steel, aluminum, copper, silica, oxides of transition metals such as copper oxide, iron oxide, ceramics such as AlN, BN, and the like, and polymers, such as epoxy, polyimide, and the like. In another embodiment, the wicking structure 108 includes at least one material selected from the group consisting of alumina, silica, iron oxide, aluminum, copper, and stainless steel, AlN, BN, epoxy, polyimide, or any combination thereof. Typically, the wicking structure 108 may be a porous material. In one embodiment, the wicking structure 108 has a pore size of less than about 50 micrometers. In another embodiment, the wicking structure 108 has a pore size in a range from about 500—nanometers to about 1 micrometers. In yet another embodiment, the wicking structure 108 has a pore size in a range from about 100 nanometers to about 500 nanometers. The wicking structure 108 may include pore having varied geometries, such as cylindrical, circular, triangular, packed sphere, mesh, spheroid, and the like. In one embodiment, the wicking structure 108 may include a channel structure.

In some embodiments, the wicking structure 108 has a thermal conductivity in a range from about 0.1 W/m-K to about 50 W/m-K. In another embodiment, the wicking structure 108 has a thermal conductivity in a range from about 200 W/m-K. To achieve a high effective conductance, several options of the wicking structure 108 have been investigated. One option is a multi-layer metallic wire cloth reporting in "*Demonstration of liquid nitrogen wicking using a multi-layer metallic wire cloth laminate*", by Tao Zhang et al., the entire contents of which is incorporated herein by reference. An efficient wicking flow of liquid nitrogen has been demonstrated with a sintered multi-layer porous lamination of metal wire (pore size as low as 5 micron meter) in an open cryogenic chamber.

In certain embodiments, the wicking structure 108 has a thickness of less than about 5 millimeters. In one embodiment, the wicking structure 108 has a thickness in a range from about 300 micrometers to about 1 millimeters. In another embodiment, the wicking structure 108 has a thickness in a range from about 1 millimeters to about 2 millimeters.

Typically, the cryogenic cooling system 100 includes a delivery system 110. The delivery system 110 is disposed to receive at least a portion of working fluid 112 from the wicking structure 108. Non-limiting examples of the working fluid 112 include cryogenic fluids, such as liquid oxygen, liquid nitrogen, liquid argon, liquid neon, liquid krypton, liquid xenon, liquid hydrogen, liquid helium, liquefied natural gas (LNG)/methane, liquid carbon dioxide, and the like. In one embodiment, the working fluid 112 is a cryogenic refrigerant. As used herein the term "cryogenic fluid" refers to refrigerated liquefied gases having a boiling point less than about −90° C. at a pressure of one atmosphere. In another embodiment, the working fluid 112 can be a mixture of two or more cryogenic fluids. In one embodiment, the working fluid 112 selected from the group consisting of liquid helium, liquid nitrogen and mixtures thereof. In another embodiment, the working fluid 112 is liquid helium. In one embodiment, the delivery system 110 includes of the working fluid 112 in a range from about 50 volume percent to about 90 volume percent.

The delivery system 110 may be filled with a vapor phase 114 of the working fluid 112 in a range from about 10 volume percent to about 50 volume percent. A heat sink 118 may be provided to condense the vapor phase 114 into droplets 120 that fall into the working fluid 112.

In the embodiment shown in FIG. 2, the delivery system 110 is disposed at an elevated position with respect to the inner wall 106. The delivery system 110 includes a wicking connection 122 for transporting the working fluid 112 from the delivery system 110 to the wicking structure 108. During operation, the wicking structure 108 exerts a capillary pressure on the liquid phase of the working fluid 112 in the delivery system 110 and the working fluid 112 is soaked up to the wicking structure 108. In this "top feed" example, a separate recondensing vessel 128 is fluidly connected through a wicking connection 122. The vapor phase 114 may be returned from the chamber 102 to the recondensing vessel 128 by means of a return vapor tube 116. A heater 126 may be used to control the level of working fluid 112 within the recondensing vessel 128. The delivery system 110 also includes a bridge structure 124. In one embodiment the bridge structure 124 is a wicking structure that is fluidly coupled to the wicking structure 108.

In the illustrated embodiment of FIG. 2, the working fluid 112 that is present in the wicking structure 108 is in thermal contact with the inner wall 106 across the wicking structure 108. As a result, heat exchange occurs between the inner wall 106 and the working fluid 112 across the wicking structure 108, thereby causing vaporization of the working fluid 112 present in the wicking structure 108, while cooling the inner wall 106. The wicking structure 108 provides an uniform distribution of the working fluid 112 due to the capillary effect and wetting property of the wicking structure 108, thereby aiding in good heat transfer between the soaked up working fluid 124 and the inner wall 106. In one embodiment, a thermal equilibrium is established between the inner wall 106, the delivery system 110, the wicking structure 108 and the vapor phase 114 of the working fluid 112 in the chamber 102.

Figure 3:
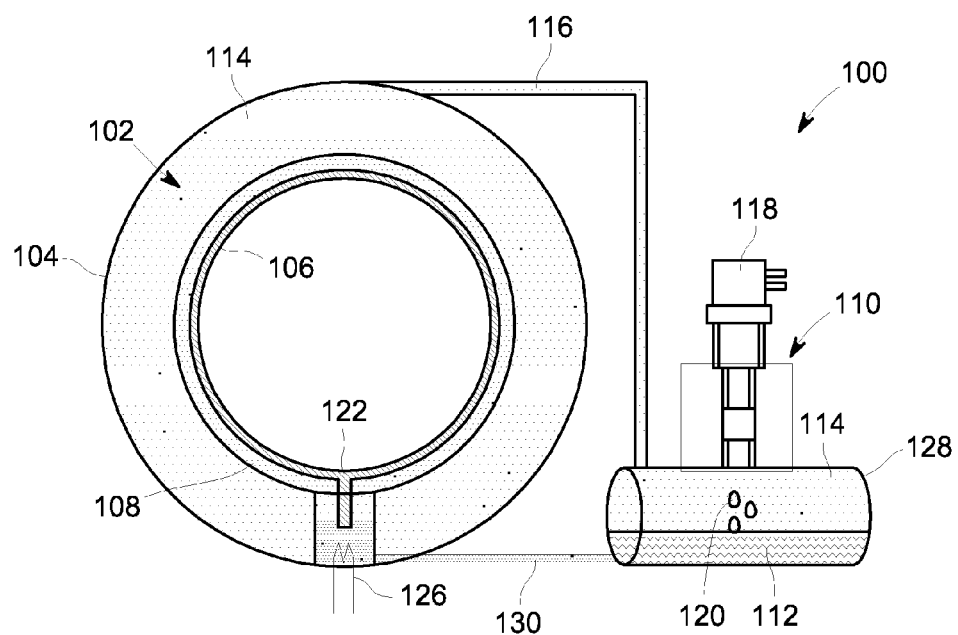
FIG. 3 is an end cross-sectional view of a "bottom feed" cryogenic cooling system with the wicking structure in thermal contact with the inner wall of the chamber according to an embodiment of the invention.

In the illustrated embodiment of FIG. 2, the delivery system 110 is disposed at an elevated position with respect to the inner wall 106 (i.e. "top feed" example). However, it will be appreciated that the invention is not limited by the position of the delivery system 110 relative to the component to be cooled, such as the inner wall 106. For example, the delivery system 110 may be positioned at an elevation that is lower than the component to be cooled (i.e., the inner wall 106), as shown in FIG. 3. In this "bottom feed" example, the recondensing vessel 128 is fluidly connected to the chamber 102 by means of a pipe 130 at the bottom of the chamber 102. The surface tension is sufficient so as to pull the working fluid 112 up the wicking structure 108 and around the inner wall 106 of the chamber 102. The heater 126 may be used to control the level of working fluid 112 within the recondensing vessel 128.

Figure 4:
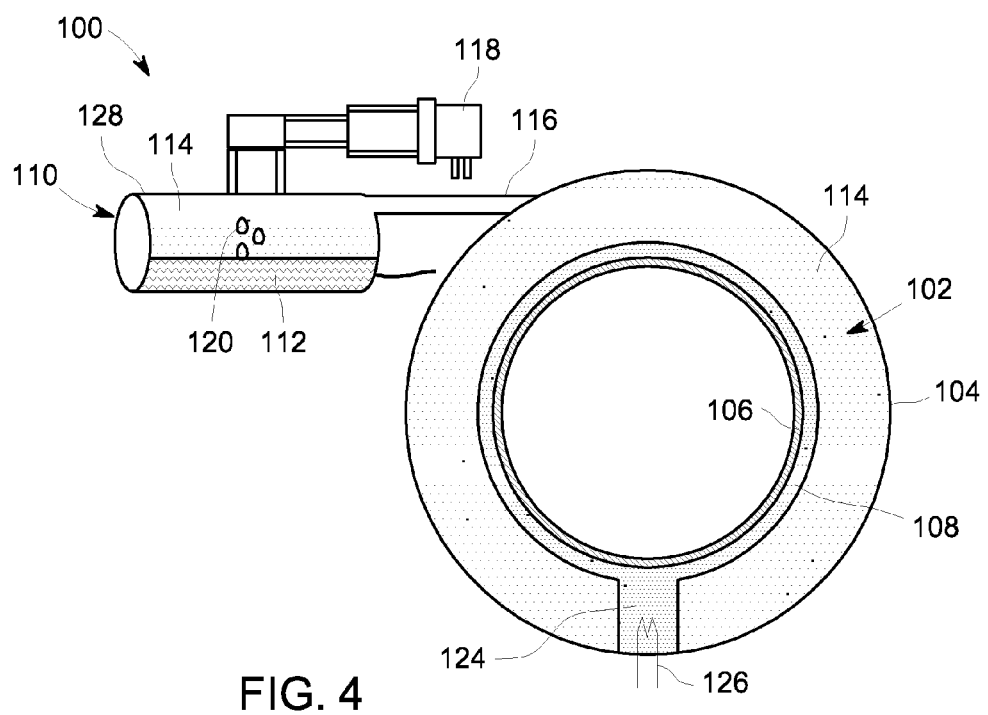
FIG. 4 is an end cross-sectional view of a "top feed" cryogenic cooling system with the wicking structure in thermal contact with an outer wall of the chamber according to an embodiment of the invention.

In addition, it will be appreciated that the invention is not limited by the wicking structure 108 in thermal contact with the inner wall 106 of the chamber 102, and that the invention can be practiced with the wicking structure 108 being in thermal contact with any component to be cooled in the MR system 100. For example, the wicking structure 108 can be in thermal contact with the outer wall 104 of the chamber 102, as shown in FIG. 4. It will be appreciated that the wicking structure 108 can be in thermal contact with both the inner wall 106 and the outer wall 104. It will also be appreciated that the delivery system 110 shown in FIG. 4 can be a "bottom feed" system, as shown in FIG. 3 with the wicking structure 108 being in thermal contact with the outer wall 108 of the chamber 102.

In the illustrated embodiment, the cryogenic cooling system 100 of the invention is a component of a magnetic resonance imaging system, or a nuclear magnetic resonance imaging system. However, it will be appreciated that the cryogenic cooling system 100 of the invention can be employed in any suitable system, such as spectroscopy systems, magnetic resonance imaging systems, nuclear magnetic resonance imaging systems, power transmission systems, nuclear reactors, biological cooling facilities, optical sensor systems or the like.

In one embodiment, the present invention provides a method of cooling a heat source. The method includes providing at least one heat source disposed in a chamber defined by an outer wall; providing a wicking structure in conformal contact with the at least one heat source, wherein the wicking structure is in fluid communication with a delivery system containing a cryogenic liquid; operatively coupling a heat sink and the delivery system, wherein the heat sink is disposed within the chamber in a spaced apart relationship with the heat source; and applying power to the at least one heat source. In one embodiment, the method of the present invention helps to maintain uniform temperature and eliminate hot spots in the heat generating components, and thereby increasing the reliability of the heat source.

In another aspect of the invention, the wicking structures on the inner boundary walls of cryogenic vessels absorb heat entering the system efficiently maintaining the inner structure in the cryogenic state.

In another aspect, the present invention provides a cooling system to remove heat from heat generating components, such as the gradient coil assembly, of a magnetic resonance imaging apparatus, while maintaining internal and external temperatures below maximum operating limits, thereby enabling higher power applications for faster imaging with improved image quality as well as, allowing longer scan times for interventional procedures.

In another aspect of the invention, the invention enables reduces requirements of liquid re-fill when the system arrives at the customer site as the total amount of liquid helium used can be reduced to near amount required to fill the wicking structure.

This written description uses examples to disclose some embodiments of the invention, including the best mode, and also to enable any person skilled in the art to practice the invention, including making and using any devices or systems, and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:
1. A cryogenic cooling system comprising:
an annular chamber defined by an outer wall and an inner wall, the annular chamber housing at least one component to be cooled;
a wicking structure disposed within the annular chamber and in thermal contact with one of the outer wall and the inner wall of the annular chamber; and a delivery system in a spaced apart relationship with the annular chamber and fluidly connected to the wicking structure for transporting a working fluid to and from the wicking structure.

2. The system of claim 1, wherein the wicking structure comprises sintered particles.

3. The system of claim 1, wherein the wicking structure has a pore size of less than about 100 nanometers.

4. The system of claim 1, wherein the wicking structure has a pore size in a range from about 100 nanometers to about 1 micrometers.

5. The system of claim 1, wherein the wicking structure has a thermal conductivity in a range from about 0.1 W/mk to about 400 w/mK.

6. The system of claim 1, wherein the wicking structure comprises at least one material selected from the group consisting of: stainless steel, aluminum, copper, silica, oxides of transition metals, a ceramic, a polymer, or any combination thereof.

7. The system of claim 1, wherein the wicking structure comprises at least one material selected from the group consisting of: stainless steel, aluminum, copper, MN, BN, silica, a polymer, or any combination thereof.

8. The system of claim 1, wherein the wicking structure has a thickness in a range from about 200 μm to about 5 mm.

9. The system of claim 1, wherein the cryogenic cooling system is a component of a magnetic resonance imaging system.

10. The system of claim 1, wherein the delivery system further comprises a bridge structure coupled to the wicking structure.

11. The system of claim 1, wherein the at least one component to be cooled comprises a superconducting magnet.

12. The system of claim 1, wherein the working fluid is a cryogenic fluid.

13. A magnetic resonance imaging system comprising:
an imaging volume to image a subject
a superconducting coil structure surrounding the imaging volume; and
a cryogenic cooling system comprising:
an annular chamber defined by an outer wall and an inner wall, the annular chamber housing at least one component to be cooled;
a wicking structure disposed within the annular chamber and in thermal contact with one of the outer wall and the inner wall of the annular chamber; and
a delivery system in a spaced apart relationship with the annular chamber and fluidly connected to the wicking structure for transporting a working fluid to and from the wicking structure.

14. The system of claim 13, wherein the wicking structure comprises sintered particles.

15. The system of claim 13, wherein the wicking structure has a pore size of less than about 100 nanometers.

16. The system of claim 13, wherein the wicking structure has a pore size in a range from about 100 nanometers to about 1 micrometers.

17. The system of claim 13, wherein the wicking structure has a thermal conductivity in a range from about 0.1 W/mk to about 400 w/mK.

18. The system of claim 13, wherein the wicking structure comprises at least one material selected from the group consisting of: stainless steel, aluminum, copper, silica, oxides of transition metals, a ceramic, a polymer, or any combination thereof.

19. The system of claim 13, wherein the wicking structure comprises at least one material selected from the group consisting of: stainless steel, aluminum, copper, MN, BN, silica, a polymer, or any combination thereof.

20. The system of claim 13, wherein the wicking structure has a thickness in a range from about 200 μm to about 5 mm.

* * * * *

UNITED STATES PATENT AND TRADEMARK OFFICE
CERTIFICATE OF CORRECTION

PATENT NO.         : 8,694,065 B2                                    Page 1 of 1
APPLICATION NO.    : 13/242057
DATED              : April 8, 2014
INVENTOR(S)        : de Bock et al.

It is certified that error appears in the above-identified patent and that said Letters Patent is hereby corrected as shown below:

In the Specification:

In Column 7, Line 37, delete "fluid 124" and insert -- fluid 112 --, therefor.

In Column 8, Line 2, delete "wall 108" and insert -- wall 104 --, therefor.

In the Claims:

In Column 9, Line 23, in Claim 7, delete "MN," and insert -- AlN, --, therefor.

In Column 10, Line 2, in Claim 13, delete "subject" and insert -- subject; --, therefor.

In Column 10, Line 32, in Claim 19, delete "MN," and insert -- AlN, --, therefor.

Signed and Sealed this
Fifteenth Day of July, 2014

Michelle K. Lee
*Deputy Director of the United States Patent and Trademark Office*